United States Patent
Ohl et al.

(10) Patent No.: US 7,791,891 B2
(45) Date of Patent: Sep. 7, 2010

(54) ENCLOSURE INCLUDING AN ELECTRICAL MODULE

(75) Inventors: Christian Ohl, Pfullingen (DE); Frieder Haag, Wannweil (DE); Juergen Kurle, Reutlingen (DE); Ingbert Gerngross, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 21 days.

(21) Appl. No.: 12/217,301

(22) Filed: Jul. 2, 2008

(65) Prior Publication Data

US 2009/0027861 A1    Jan. 29, 2009

(30) Foreign Application Priority Data

Jul. 6, 2007   (DE) ................ 10 2007 031 562

(51) Int. Cl.
*H05K 7/00*    (2006.01)
(52) U.S. Cl. ...................... 361/728; 361/803
(58) Field of Classification Search ............. 361/728, 361/807–810, 803
See application file for complete search history.

(56) References Cited

U.S. PATENT DOCUMENTS

| | | | | |
|---|---|---|---|---|
| 5,948,991 | A * | 9/1999 | Nomura et al. | 73/727 |
| 6,615,669 | B1 * | 9/2003 | Nishimura et al. | 73/756 |
| 6,668,658 | B2 * | 12/2003 | Woersinger et al. | 73/723 |
| 6,686,638 | B2 * | 2/2004 | Fischer et al. | 257/415 |
| 6,805,010 | B2 * | 10/2004 | Kuhnt et al. | 73/756 |

\* cited by examiner

*Primary Examiner*—Hung S Bui
(74) *Attorney, Agent, or Firm*—Kenyon & Kenyon LLP

(57) ABSTRACT

A module includes an electrical component having an inner enclosure which surrounds the electrical component and which has first electrical contact means at least on one outer side; having an outer enclosure in the interior of which the inner enclosure is situated, the outer enclosure having second electrical contact means, the second electrical contact means extending from the interior to at least one outer side of the outer enclosure. The first and second contact means are interconnected.

11 Claims, 1 Drawing Sheet

ENCLOSURE INCLUDING AN ELECTRICAL MODULE

FIELD OF THE INVENTION

The present invention is directed to a module including an electrical component having an inner enclosure which surrounds the electrical component and which has first electrical contact means at least on one outer side; having an outer enclosure in the interior of which the inner enclosure is situated, the outer enclosure having second electrical contact means, the second electrical contact means extending from the interior to at least one outer side of the outer enclosure.

BACKGROUND INFORMATION

According to the related art, a micromechanical sensor is packaged in a chip enclosure made of plastic having a metallic or organic substrate (lead frame, laminate) as a sensor element. For use as a peripheral sensor, e.g., for peripheral acceleration sensors in motor vehicles, the sensor elements are mounted on a p.c. board as an intermediate carrier in an outer enclosure.

SUMMARY OF THE INVENTION

The present invention is directed to a module including an electrical component, having an inner enclosure which surrounds the electrical component and which has first electrical contact means at least on one outer side; having an outer enclosure in the interior of which the inner enclosure is situated, the outer enclosure having second electrical contact means, the second electrical contact means extending from the interior to at least one outer side of the outer enclosure. A core of the present invention is that the first and second contact means are interconnected. The first and second contact means are advantageously connected directly to each other, i.e., without a p.c. board situated between them. This enables the module according to the present invention to be manufactured more easily, more economically and in a smaller size.

According to an advantageous embodiment of the present invention, the first and second contact means are situated diametrically opposed to each other at least in one region, and the electrical component is situated between the first and second contact means in this region. An electromagnetic shielding for the electrical component is advantageously created thereby. According to an advantageous embodiment of the present invention, the first and second contact means are interconnected by a weld connection, a solder connection, a press connection or a wire bond connection. The fact that the inner enclosure is mounted in the outer enclosure via an adhesive connection, a casting compound or as a result of extrusion is also advantageous. According to a particularly advantageous embodiment of the present invention, the module is a sensor module, the electrical component being a sensor, in particular a micromechanically designed sensor. Apart from the electrical component, additional structural components, which are situated on the p.c. board according to the related art, are advantageously integrated in the sensor module.

A sensor having a micromechanical sensor element in which the sensor module enclosure is built directly into the outer enclosure without an additional p.c. board is advantageous. By suitably positioning the structural components, the sensor element and the electronic analyzer circuit are effectively protected against electric and magnetic interference fields and against environmental influences. In addition, necessary passive electrical components, such as ceramic chip capacitors, may optionally be integrated into the module enclosure. The structure according to the present invention offers a number of advantages. The sensor may be manufactured economically without a p.c. board or any other carrier or any other substrate. The size of the sensor may be reduced. Assembly steps and processes for mounting and contacting the sensor module on the p.c. board are eliminated, such as SMD mounting and soldering. Assembly steps for mounting and contacting the p.c. board in the outer enclosure such as press-in are eliminated. This may save costs and improve quality. In the case of the module according to the present invention, techniques which are incompatible with conventional p.c. board technology or would impair quality, such as casting or direct extrusion of the outer enclosure onto the inner enclosure, may be used for sealing the outer enclosure.

DETAILED DESCRIPTION

Figure 1:
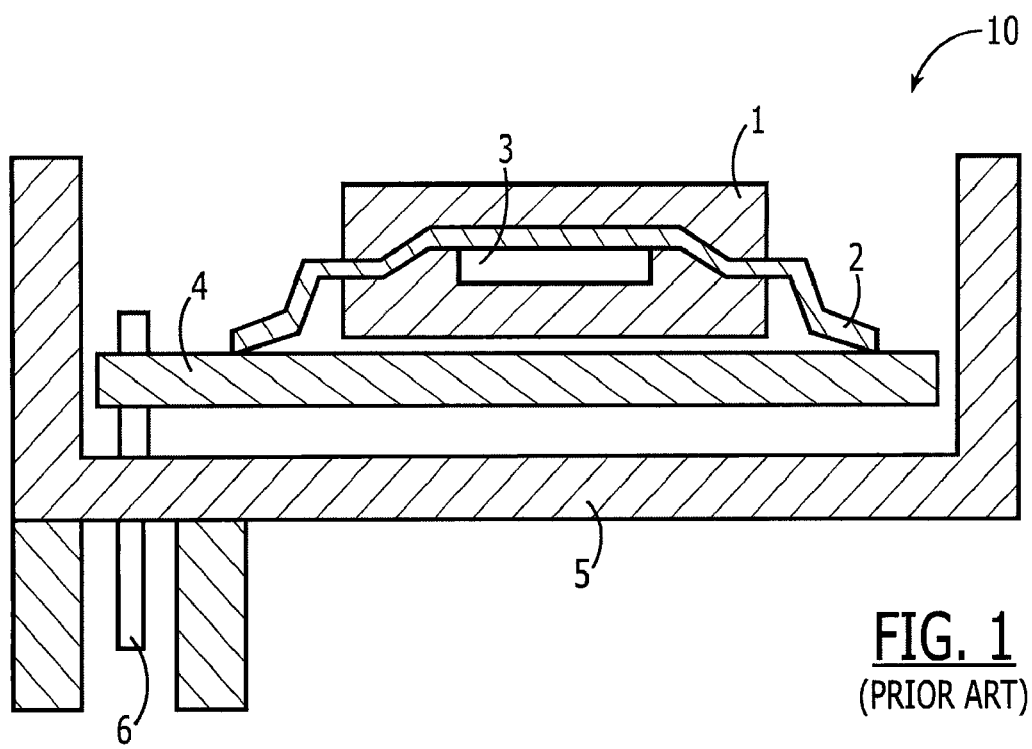
FIG. 1 shows a module having an electrical component according to the related art.

FIG. 1 shows a module having an electrical component according to the related art. According to the related art, a micromechanical sensor 3 is packaged in a chip enclosure 1 made of plastic having a metallic or organic substrate (lead frame, laminate) as a sensor element. For use as a peripheral sensor, e.g., for peripheral acceleration sensors in motor vehicles, the sensor elements are mounted on a p.c. board 4 as an intermediate carrier in an outer enclosure 5. Additional passive electrical components, usually ceramic capacitors, are also often provided on p.c. board 4. As EMC protection, the module is frequently situated on p.c. board 4 in such a way that sensor chips 3 or also analyzer circuits 3 lie between carrier tape (lead frame) 2 contained in chip enclosure 1 and a metallic surface, e.g., a ground surface on p.c. board 4, to achieve a metallic shielding. P.c. board 4 is mounted in outer enclosure 5 and on contact pins 6 which extend from the interior of outer enclosure 5 to an outer side and provide electrical contacting means to the outside.

Figure 2:
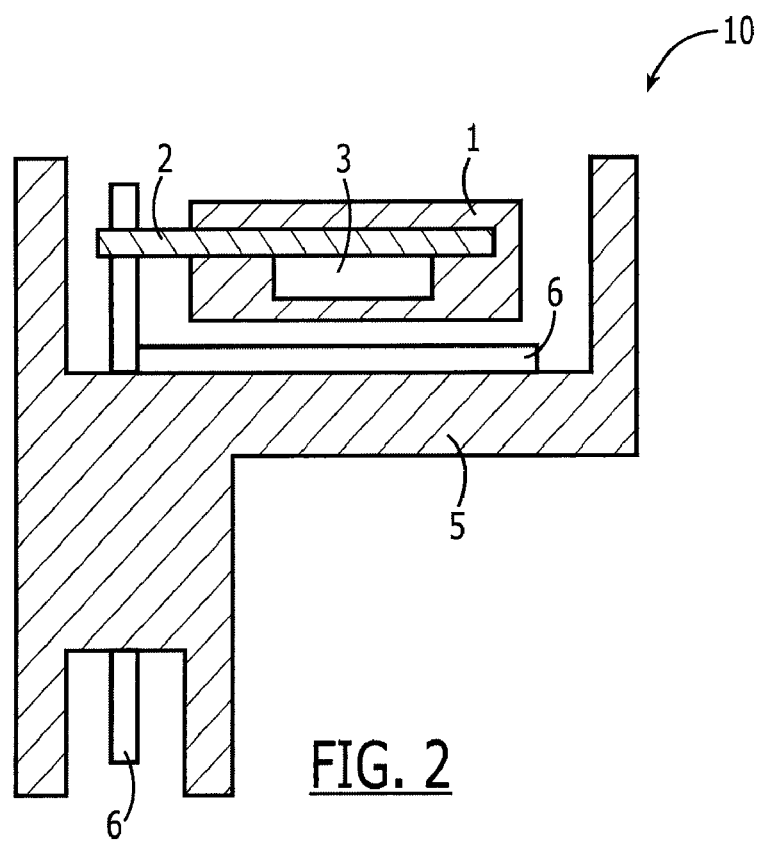
FIG. 2 shows a module according to the present invention having an electrical component.

FIG. 2 shows a module according to the present invention having an electrical component. A sensor element 1, which includes a micromechanical sensor chip 3 having an analyzer circuit and a metallic lead frame 2, is built into an outer enclosure 5. As an alternative to the metallic lead frame, the module may also include a laminate as the carrier substrate having metallic conductor tracks (LGA). Metallic terminal pins 6 are provided in the outer enclosure for contacting the sensor module. Pins 6 are designed in such a way that a portion of one of terminal pins 6 is situated flatly beneath sensor element 1, so that the sensor chip and analyzer circuit 3 lie between metallic lead frame 2 of module enclosure 1 and the flat portion of terminal pin 6. This achieves an effective metallic shielding of the sensor chip and analyzer circuit 3.

Sensor element 1 is mounted in the outer enclosure by gluing, casting or extrusion of suitable materials. The electrical terminals of the sensor module are connected in an electrically conductive manner to the terminal pins, e.g., by a weld, solder or wire bond connection, cold contacting techniques (such as pressing) or anisotropic or isotropic conductive adhesives.

Additional active or passive structural components needed to operate sensor element 1 may be integrated into sensor element 1 or analyzer circuit 3 contained in sensor element 1. An additional substrate 4 (p.c. board), like that according to the related art, is not necessary.

The present invention is not limited to sensor modules. A generalized exemplary embodiment according to schematic FIG. 2 describes a module 10 including an electrical component 3 having an inner enclosure 1, which at least partially surrounds electrical component 3 and which, at least on one outer side, has first electrical contact means 2 which make electrical component 3 electrically contactable. Module 10 also has an outer enclosure 5 in the interior of which inner enclosure 1 is situated. Outer enclosure 5 has second electrical contact means 6, which extend from the interior of external enclosure 5 to at least one outer side of outer enclosure 5. According to the present invention, first and second contact means 2, 6 are interconnected. This connection is direct, that is, it is designed without an intermediate p.c. board 4 (according to FIG. 1) or another substrate situated therebetween. First and second contact means 2, 6 may be situated diametrically opposed to each other at least in one region, as shown here, electrical component 3 being situated in this region between first and second contact means 2, 6 in such a way that first and second contact means 2, 6 form an electromagnetic shielding for electrical component 3.

What is claimed is:

1. A module, comprising:
   an electrical component;
   an inner enclosure which surrounds the electrical component and which has at least one first electrical contact at least on one outer side;
   an outer enclosure in an interior of which the inner enclosure is situated, the outer enclosure having at least one second electrical contact, the second electrical contact extending from the interior to at least one outer side of the outer enclosure; and
   pins, wherein at least one pin is a terminal pin situated flatly beneath the sensor module;
   wherein the first and second contacts are interconnected,
   wherein the first contact and the second contact form an electromagnetic shielding for the electrical component,
   wherein the module is a sensor module, and the electrical component is a micromechanical sensor, and
   wherein the first and second contacts are situated diametrically opposed to each other at least in one region, and the electrical component is situated between the first and second contacts in the region.

2. The module according to claim 1, wherein the first and second contacts are connected to each other by a weld connection, a solder connection, a press connection or a wire bond connection.

3. The module according to claim 1, wherein the inner enclosure is mounted in the outer enclosure by an adhesive connection, a casting compound or by extrusion.

4. The module according to claim 1, wherein the electrical component is built directly into the outer enclosure without an additional p.c. board.

5. The module according to claim 1, wherein the micromechanical sensor includes an analyzer circuit and a metallic lead frame which is built into the outer enclosure.

6. The module according to claim 1, wherein the micromechanical sensor includes an analyzer circuit and a laminate as a carrier substrate having metallic conductor tracks, which is built into the outer enclosure.

7. The module according to claim 1, wherein the first and second contacts are connected to each other by a weld connection, a solder connection, a press connection or a wire bond connection, and wherein the inner enclosure is mounted in the outer enclosure by an adhesive connection, a casting compound or by extrusion.

8. The module according to claim 7,
   wherein the electrical component is built directly into the outer enclosure without an additional p.c. board, wherein passive electrical components are integrated into the module enclosure, and wherein the micromechanical sensor includes an analyzer circuit and a metallic lead frame which is built into the outer enclosure.

9. The module according to claim 7,
   wherein the electrical component is built directly into the outer enclosure without an additional p.c. board, wherein passive electrical components are integrated into the module enclosure, and wherein the micromechanical sensor includes an analyzer circuit and a laminate as a carrier substrate having metallic conductor tracks, which is built into the outer enclosure.

10. The module according to claim 1,
    wherein the electrical component is built directly into the outer enclosure without an additional p.c. board, wherein passive electrical components are integrated into the module enclosure, and wherein the micromechanical sensor includes an analyzer circuit and a metallic lead frame which is built into the outer enclosure.

11. The module according to claim 1,
    wherein the electrical component is built directly into the outer enclosure without an additional p.c. board, wherein passive electrical components are integrated into the module enclosure, and wherein the micromechanical sensor includes an analyzer circuit and a laminate as a carrier substrate having metallic conductor tracks, which is built into the outer enclosure.

* * * * *